United States Patent
Nakamori et al.

(10) Patent No.: US 7,190,299 B2
(45) Date of Patent: Mar. 13, 2007

(54) CURRENT CONTROL METHOD AND APPLICATION THEREOF

(75) Inventors: Takafumi Nakamori, Mizuho (JP); Atsushi Wada, Ogaki (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 11/212,748

(22) Filed: Aug. 29, 2005

(65) Prior Publication Data

US 2006/0033652 A1    Feb. 16, 2006

Related U.S. Application Data

(62) Division of application No. 10/721,096, filed on Nov. 26, 2003, now Pat. No. 6,943,720.

(30) Foreign Application Priority Data

Nov. 28, 2002    (JP) .............................. 2002-346485

(51) Int. Cl.
*H03M 1/12*    (2006.01)
(52) U.S. Cl. ..................................... 341/156
(58) Field of Classification Search .................. 333/65, 333/133, 134, 254, 255; 341/155, 156
See application file for complete search history.

(56) References Cited

U.S. PATENT DOCUMENTS 6,259,901 B1 * 7/2001 Shinomiya et al. ...... 455/127.3
6,492,872 B1 * 12/2002 Fujioka et al. ............. 330/285
6,753,734 B2   6/2004 Arell et al.
6,765,443 B2   7/2004 Pehike
6,870,425 B2   3/2005 Leifso et al.

FOREIGN PATENT DOCUMENTS

JP    2001-028519    1/2001
JP    2001-053564    2/2001

* cited by examiner

*Primary Examiner*—Brian Young
(74) *Attorney, Agent, or Firm*—McDermott Will & Emery LLP

(57) ABSTRACT

A current supply circuit supplies a bias current to operational amplifiers which constitute a pipelined AD converter. A current switching circuit switches between output currents in response to a current control signal from current control means, thereby switching between currents to be supplied from a bias circuit to the operational amplifiers via transistors. A sufficiently large current enough for the amplifiers to operate at a high frequency is supplied, while the current is switched to a lower supply current for the amplifier to operate at lower frequencies.

13 Claims, 5 Drawing Sheets

CURRENT CONTROL METHOD AND APPLICATION THEREOF

RELATED APPLICATION

This application is a divisional of Application Ser. No. 10/721,096, filed Nov. 26, 2003 is now a U.S. Pat. No. 6,943,720.

BACKGROUND OF THE INVENTION

1. Field of the Invention

The present invention relates to electric circuits, and more particularly to a semiconductor circuit, an AD converter, an electronic device, or a receiver with an amplifier, a current supply circuit for supplying a current to the amplifier, and a method for controlling a current to be supplied to the amplifier.

2. Description of the Related Art

An example of the circuits for converting an input analog signal to a digital signal is a pipelined AD converter. The pipelined AD converter includes low-bit sub-AD converters which are arranged in multiple stages to allow each of the sub-AD converters to perform AD conversion in a stepwise manner. The pipelined AD converter is configured such that an operational amplifier is interposed between the stages of the sub-AD converters to amplify an input analog signal to the sub-AD converter in the next stage.

A single pipelined AD converter may be operated at a plurality of different operational frequencies in a device incorporating the pipelined AD converter. In this case, it is necessary to design the circuit to the most demanding characteristics among those operation modes, i.e., to the operation at the highest frequency. In general, the higher the operational frequency of the pipelined AD converter, the greater the current consumption required in the operational amplifiers that constitute the converter. Thus, the circuit was designed such that an enough current to operate at the highest frequency among a plurality of operation modes was supplied to the operational amplifiers in all the operation modes.

However, when operated in an operation mode at a lower operational frequency, the circuit designed as described above supplied current more than necessary, causing unnecessary power consumption.

Patent reference 1: Japanese Patent Laid-Open Publication No. 2001-28519

SUMMARY OF THE INVENTION

The present invention was developed in view of the aforementioned problems. It is therefore an object of the present invention to provide a technique for reducing power consumption in a circuit with an amplifier.

An aspect of the present invention relates to a control method. The method includes varying the value of a current required for an amplifier to operate, in response to the operational frequency of the amplifier when the current is supplied to the amplifier. The method allows for supplying a current enough for the amplifier to operate at a high operational frequency while switching the supply current to a lower current for the amplifier to operate at a lower operational frequency, thereby reducing power consumption.

Another aspect of the present invention relates to a current supply circuit for supplying a current required for an amplifier to operate. The current supply circuit includes current switching means which receives a current control signal delivered responsive of switching between operational frequencies of the amplifier to switch between currents to be supplied to the amplifier.

A still another aspect of the present invention relates to a semiconductor circuit. The semiconductor circuit includes a plurality of amplifiers, and current switching means which receives a current control signal delivered responsive of switching between operational frequencies of the amplifier to switch between currents to be supplied to the plurality of amplifiers.

The semiconductor circuit may further include a bias circuit which is connected to each of the plurality of amplifiers to supply a bias current to the amplifier. The current switching means may switch between currents to be delivered to the bias circuit to thereby switch between currents to be supplied to the plurality of amplifiers.

The current switching means may collectively switch between currents to be supplied to the plurality of amplifiers. For example, single current switching means may be used to collectively switch between currents to be supplied to all the amplifiers constituting the circuit. The current switching means may also be provided corresponding to each of the plurality of amplifiers to switch between currents to be supplied to the amplifier connected to itself.

The current switching means may be a circuit formed of a plurality of current paths arranged in parallel to each other. Each of the current paths may include a transistor circuit with the gate terminal and the drain terminal short-circuited and a switching circuit. The current switching means allows the switching circuit to be turned on or off to select a current path, thereby delivering a current determined by the characteristics of the transistor circuit. The switching circuit may also be formed of MOSFET.

Another aspect of the present invention relates to an AD converter. The AD converter includes a plurality of sub-AD converter circuits connected in series, an amplifier, and current switching means. The amplifier is interposed between the sub-AD converter circuits to amplify an input signal to a sub-AD converter circuit at the next stage. The current switching means receives a current control signal delivered responsive of switching between operational frequencies of the amplifier to switch between currents to be supplied to the amplifier.

Another aspect of the present invention relates to an electronic device. The electronic device includes a plurality of amplifiers, current control means, and current switching means. The current control means controls a current to be supplied to the amplifier responsive of switching between operational frequencies of the amplifier. The current switching means receives a current control signal delivered by the current control means to switch between currents to be supplied to the plurality of amplifiers.

Another aspect of the present invention also relates to an electronic device. The electronic device includes an AD converter which comprises a plurality of sub-AD converter circuits connected in series, an amplifier which is interposed between sub-AD converter circuits to amplify an input signal to a sub-AD converter circuit at the next stage, and current switching means which switches currents to be supplied to said amplifier; frequency control means which switches operational frequency of said amplifier; and current control means which transmits a current control signal to said current switching means for controlling a current to be supplied to said amplifier responsive of switching between operational frequencies of said amplifier, wherein, when said AD converter converts input signals of a plurality of series in a time division manner, said frequency control means switches the operational frequency responsive to the number of said series.

Said operational frequency may be increased by said frequency control means as the number of said series becomes larger, and said current to be provided to said amplifier may be increased by the current control means as said operational frequency becomes higher. Thereby, an enough current to operate the amplifier can be supplied adequately. Said current control means may reduce a current to be supplied to the amplifier as said operational frequency becomes lower. Thereby, power consumption can be reduced. The above mentioned control of the current or the frequency may be the digital or discrete changeover. The current or the frequency can be changed dynamically. The current or the frequency changeover may be correspond to the changeover of the operating mode of the electric device system. The current or the frequency can be arbitrarily changed at operating, for example, corresponding to the low power mode.

Another aspect of the present invention relates to a receiver. The receiver includes a plurality of antennas; an AD converter which comprises a plurality of sub-AD converter circuits connected in series, an amplifier which is interposed between sub-AD converter circuits to amplify an input signal to a sub-AD converter circuit at the next stage, and current switching means which switches currents to be supplied to said amplifier; frequency control means which switches operational frequency of said amplifier; and current control means which transmits a current control signal to said current switching means for controlling a current to be supplied to said amplifier responsive of switching between operational frequencies of said amplifier, wherein, when said AD converter converts input signals of a plurality of series, which are received by said plurality of antennas, in a time division manner, said frequency control means switches the operational frequency responsive to the number of said series.

When the receiver is operated in a mode where analog signals are received by one antenna, the frequency control means may specify lower operational frequency than an operational frequency in a diversity reception mode where analog signals are received by a plurality of antennas. Said current control means may increase said current to be supplied to said amplifier as said operational frequency becomes higher.

Any combinations of the aforementioned components and the representations of the present invention replaced by a method, an apparatus, a system and the like are also included in the scope of the present invention.

DETAILED DESCRIPTION OF THE INVENTION

The invention will now be described based on preferred embodiments which do not intend to limit the scope of the present invention but exemplify the invention. All of the features and the combinations thereof described in the embodiments are not necessarily essential to the invention.

(First Embodiment)

Figure 1:
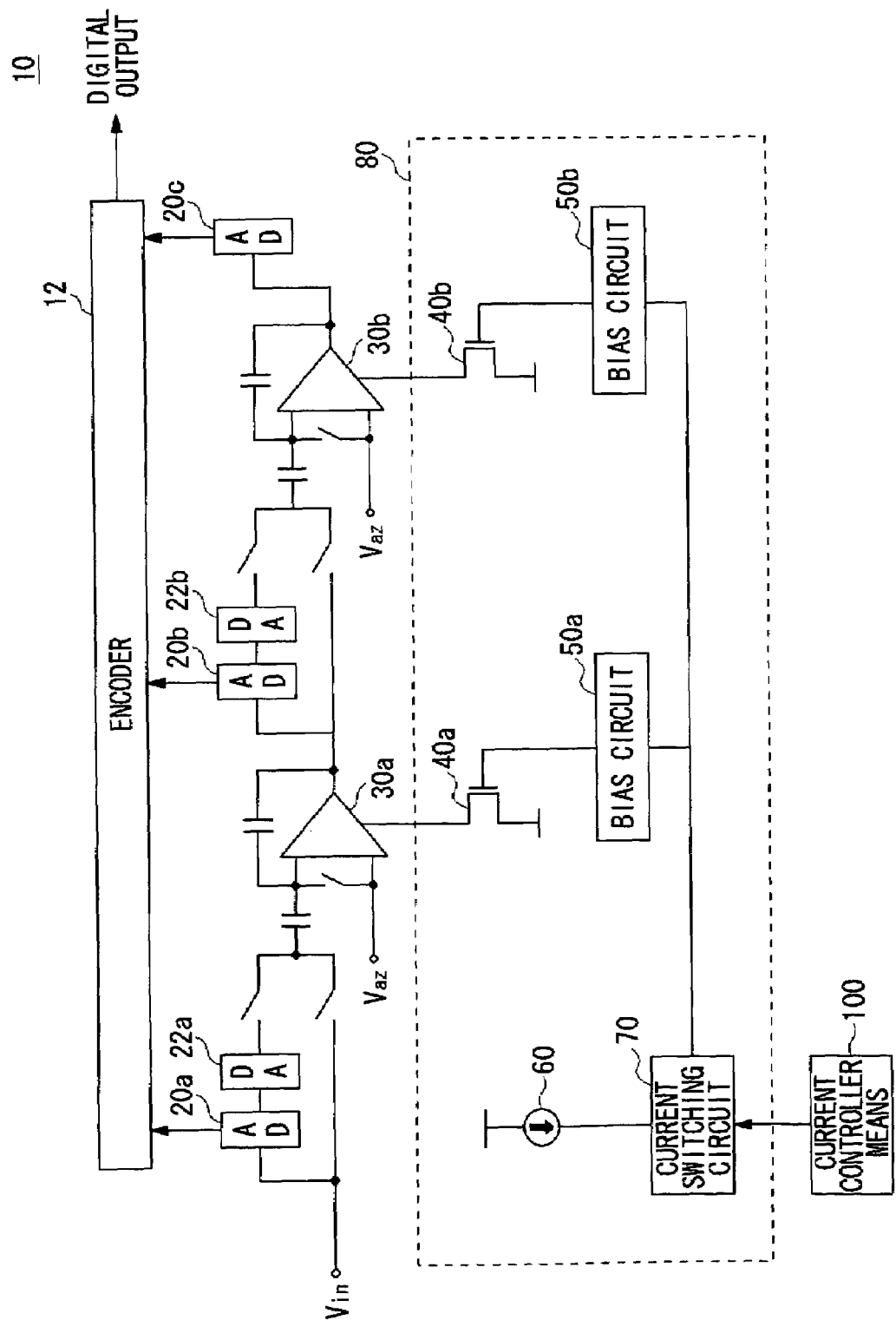
FIG. 1 is a view illustrating the circuit configuration of a pipelined AD converter according to a first embodiment.

FIG. 1 illustrates the overall configuration of a pipelined AD converter 10 according to a first embodiment of the present invention. An input analog signal $V_{in}$ to the input terminal is supplied to a first-stage sub-AD converter 20a to be converted into a digital signal of a predetermined number of bits. This digital signal is delivered to an encoder 12 and a sub-DA converter 22a. The sub-DA converter 22a converts the digital signal delivered from the sub-AD converter 20a to an analog signal. An output signal from the sub-DA converter 22a is then subtracted from the input signal to the sub-AD converter 20a and then amplified at an operational amplifier 30a, thereby providing an input signal to a sub-AD converter 20b in the next stage. The aforementioned signal processing is repeated for a predetermined number of stages to perform AD conversion in a stepwise manner, finally allowing a digital signal to be delivered from the encoder 12.

The pipelined AD converter 10 includes a current supply circuit 80 which supplies a bias current to the operational amplifiers 30a and 30b, which constitute the pipelined AD converter 10. The current supply circuit 80 is designed to switchably supply a bias current to the respective operational amplifiers 30. The current supply circuit 80 includes bias circuits 50a and 50b connected to the operational amplifiers 30a and 30b, respectively, transistors 40a and 40b interposed between the bias circuits 50a and 50b and the operational amplifiers 30a and 30b, respectively, a constant-current power supply 60, and a current switching circuit 70.

The current switching circuit 70 switches a current supplied from the constant-current power supply 60 to a plurality of currents having different values in response to a current control signal from current controller 100 to deliver the currents to the bias circuits 50a and 50b. The currents adjusted at the bias circuits 50a and 50b are supplied to the gate electrodes of the transistors 40a and 40b, respectively. Since the source-drain currents of the transistors 40a and 40b vary with a change in the currents to the gate electrodes, the currents consumed at the operational amplifiers 30a and 30b are switched. In this embodiment, the current switching circuit 70 collectively switches between the currents to be supplied to the plurality of operational amplifiers 30a and 30b. That is, a single current switching circuit 70 collectively switches between the bias currents to all the operational amplifiers 30 that constitute the pipelined AD converter 10.

The current controller 100 sends a current control signal to the current switching circuit 70 in response to the operational frequency required of the pipelined AD converter 10. In general, the higher the bias current to be supplied to the operational amplifiers 30 that constitute the pipelined AD converter 10 is, the higher the slew rate of the operational amplifiers 30 is. This makes it possible to implement AD conversion at higher frequencies. That is, an enough bias current needs to be supplied for the pipelined AD converter 10 to operate at a high frequency, whereas a current less than the current for the higher frequency operation is just enough for the pipelined AD converter 10 to operate at lower frequencies. Thus, the current supply circuit 80 according to this embodiment supplies an enough bias current for the pipelined AD converter 10 to operate when it is required of a high frequency AD conversion, whereas switching the current to a lower bias current to perform AD conversion at lower frequencies, thereby reducing power consumption. This enables an appropriate bias current to be supplied in response to an operational frequency, thereby eliminating unnecessary current consumption and reducing power consumption when compared with a prior art circuit in which a constant bias current is supplied irrespective of operational frequencies.

For example, suppose that the operational frequency of the pipelined AD converter 10 is switched in response to the operation mode of an electronic device incorporating the pipelined AD converter 10. In this case, the current controller 100 may be a program for controlling the operation mode of the electronic device. In terms of hardware, the current controller 100 can be implemented with a CPU, a memory, etc. In an operation mode requiring a high frequency AD conversion, the current controller 100 sends to the current switching circuit 70 a current control signal requesting the delivery of a current necessary to implement a high slew rate. In an operation mode for performing a low frequency AD conversion, on the other hand, the current controller 100 sends to the current switching circuit 70 a current control signal requesting the delivery of a current lower than the current required for the high frequency operation. This arrangement allows a bias current to be dynamically controlled in response to variations in operational frequency required of the pipelined AD converter 10, thereby reducing average power consumption. The current controller 100 may also be implemented with hardware such as a system register.

The current controller 100 may also statically switch the value of bias currents. For example, suppose that the operational frequency of the pipelined AD converter 10 is changed in its design. In this case, to enable a bias current to be set which is suitable for an operation at a changed operational frequency, a current supply circuit 80 may be provided in advance which can supply a bias current having a plurality of values. After an operational frequency has been finally determined, a current control signal is provided to the current switching circuit 70 to supply an appropriate bias current. In this case, the current controller 100 may be a changeover switch such as a DIP switch or a program such as a firmware or a driver. The current switching circuit 70 may also be provided with a switching element such as a DIP switch so as to be externally switchable. A program such as firmware can be updated externally after the device has been completed. This makes it possible to set an appropriate bias current corresponding to a change in operational frequency of the pipelined AD converter 10 even after the apparatus has been completed, thereby reducing unnecessary power consumption.

Figure 2:
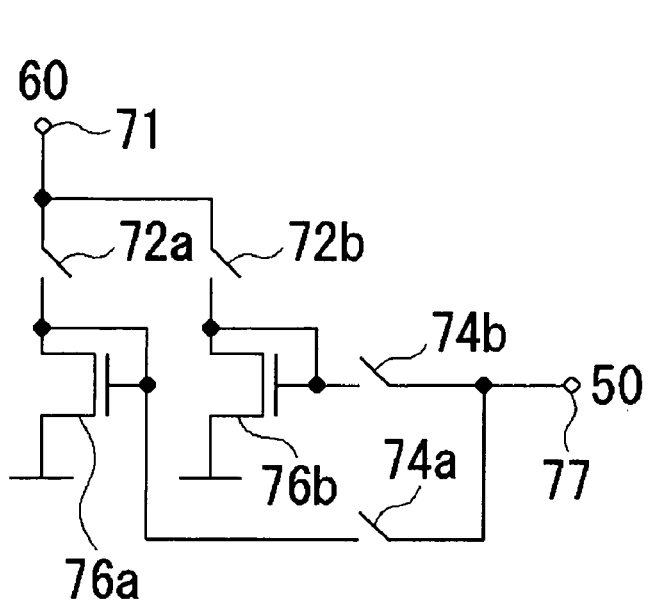
FIG. 2 is a view illustrating an exemplary circuit configuration of a current switching circuit.

FIG. 2 illustrates an exemplary circuit configuration of the current switching circuit 70. The current switching circuit 70 receives at an input terminal 71 a current supplied by the constant-current power supply 60 and outputs a current from an output terminal 77 to the bias circuit 50. There are two current paths connected in parallel to each other between the input terminal 71 and the output terminal 77. A first path includes a switching element 72a, a transistor 76a, and a switching element 74a from the input terminal 71 side in that order. Likewise, the second path includes a switching element 72b, a transistor 76b, and a switching element 74b connected in that order. Each of the transistors 76a and 76b has a source electrode connected to the ground and gate and drain electrodes short-circuited to serve as a rectifying load resistance. That is, the transistors 76a and 76b having different characteristics allow the first and second paths to deliver different currents therefrom.

Turning on or off the switching elements 72a, 72b, 74a, and 74b allows a current path to be selected so as to switch between output currents. The properties of the transistors 76a and 76b can be changed to switch between output currents, while all of the switching elements 72a, 72b, 74a and 74b. In practice, the switching elements 72a, 72b, 74a, and 74b may be implemented with MOSFET, to which a current control signal can be supplied from the current controller 100 to perform on/off control on the switches. FIG. 2 shows an example which allows switching between two types of current values, but three or more types of current paths may also be provided. A variable resistor or the like can also be used to provide continuous control to the value of current.

Figure 3:
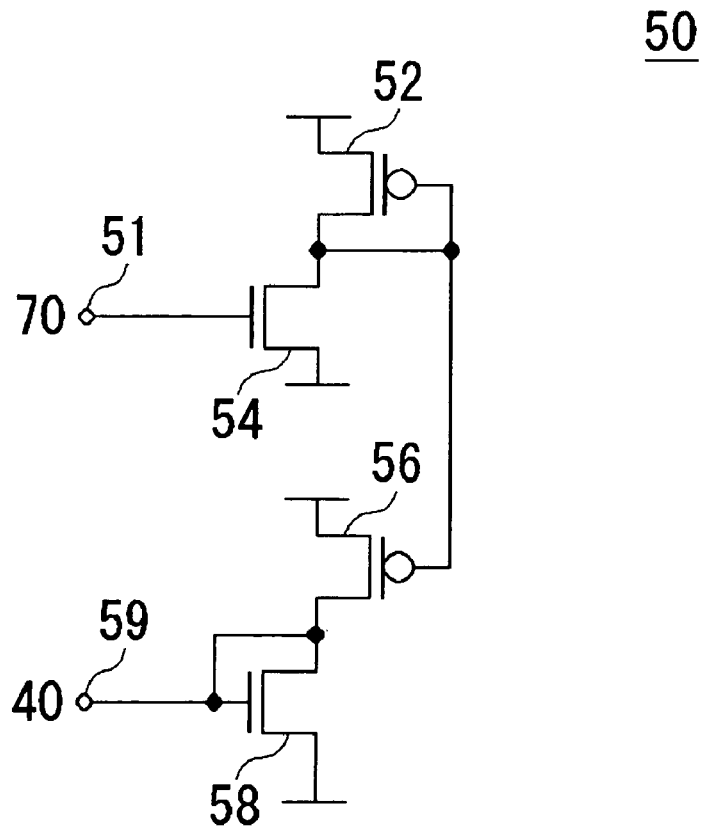
FIG. 3 is a view illustrating an exemplary circuit configuration of a bias circuit.

FIG. 3 illustrates an exemplary circuit configuration of the bias circuit 50. The bias circuit 50 includes four transistors 52, 54, 56, and 58 to adjust the current supplied from the current switching circuit 70 to an input terminal 51 for delivery from an output terminal 59 to the transistor 40. The bias circuit 50 shown in FIG. 3 is only an example, and any bias circuit is applicable.

Figure 4:
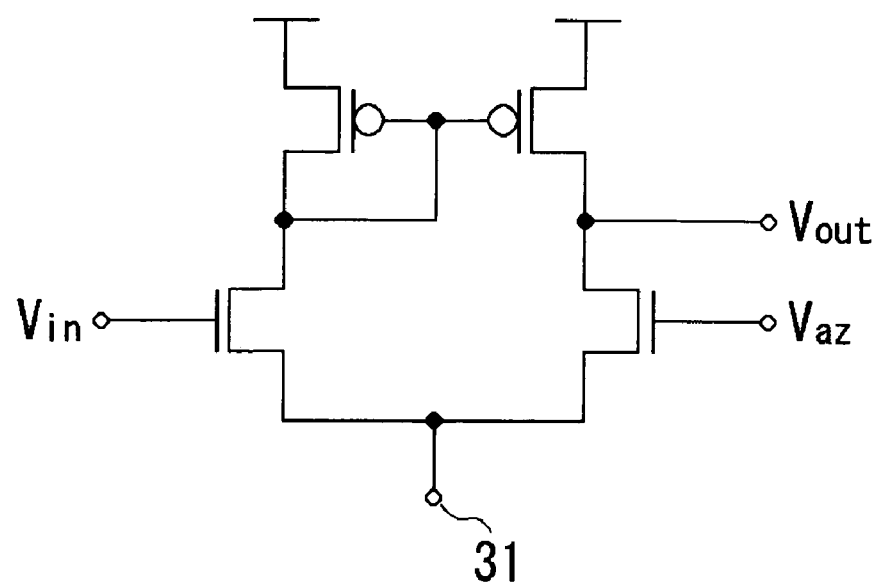
FIG. 4 is a view illustrating an exemplary circuit configuration of an operational amplifier.

FIG. 4 illustrates an exemplary circuit configuration of the operational amplifier 30. The operational amplifier 30 operates with a bias current that is supplied from the bias circuit 50 to a bias current input terminal 31 via the transistor 40. The operational amplifier 30 amplifies the difference between an input voltage $V_{in}$ and an auto-zero voltage $V_{az}$ to create an output voltage $V_{out}$. FIG. 4 illustrates an example in which the operational amplifier 30 is formed of an active load circuit, but any other operational amplifier 30 may also be applicable. Preferably, a bias current is variably controlled within the range in which the operational amplifier 30 maintains its ideal characteristics.

Any combination of the circuit shown in FIG. 1 may also be constructed as an LSI. To implement the current controller 100 using registers or the like, the registers may also be included in the LSI.

(Second Embodiment)

Figure 5:
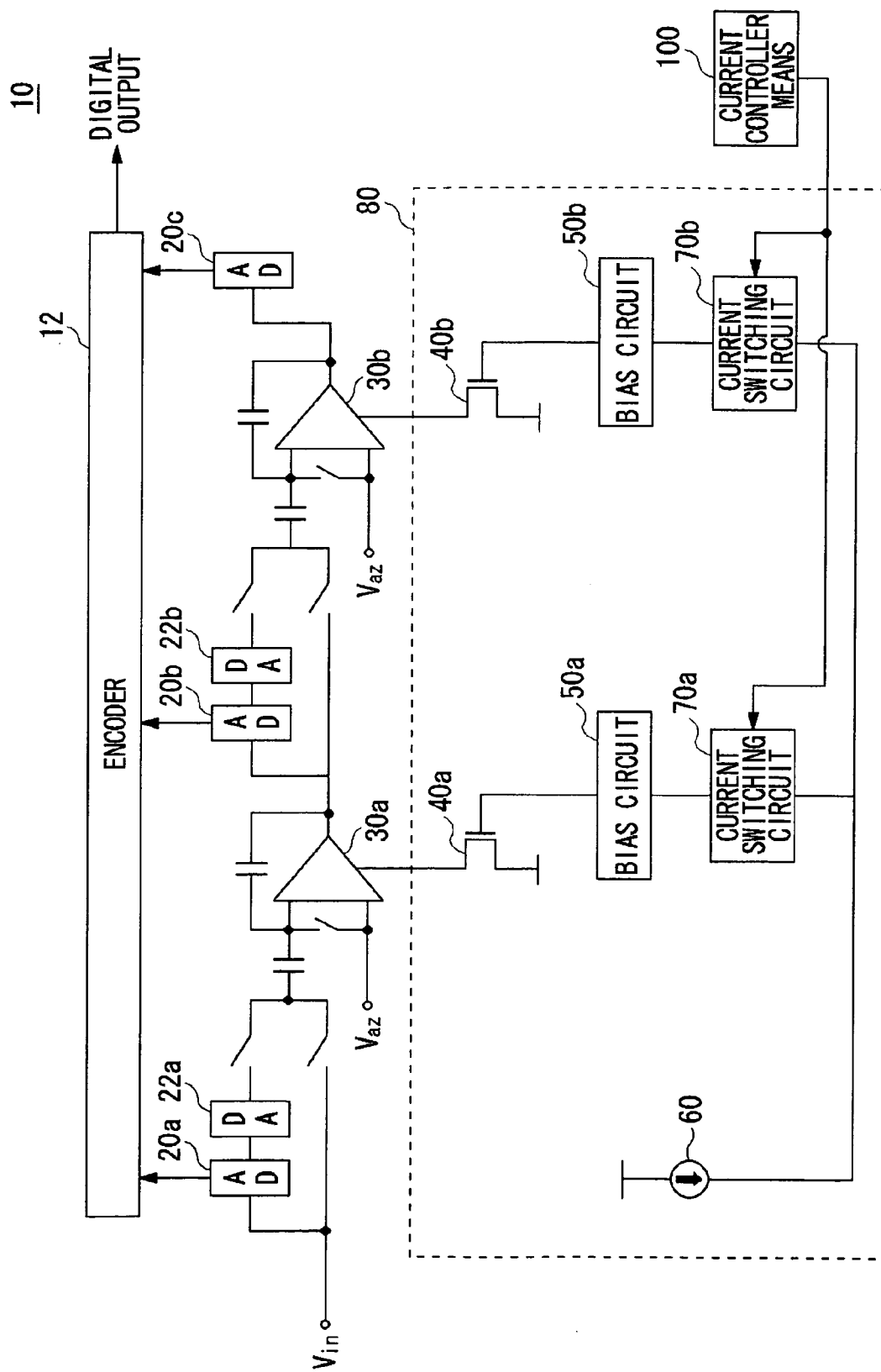
FIG. 5 is a view illustrating the circuit configuration of a pipelined AD converter according to a second embodiment.

FIG. 5 illustrates the overall configuration of a pipelined AD converter 10 according to a second embodiment of the present invention. In the first embodiment, the single current switching circuit 70 switches between the bias currents supplied to all the operational amplifiers 30. However, this embodiment provides current switching circuits 70a and 70b which can switch between bias current values for each of the operational amplifiers 30. The same components as those of the pipelined AD converter 10 according to the first embodiment shown in FIG. 1 are indicated with the same reference symbols. The following descriptions are mainly made to the functions that are different from those of the first embodiment.

The current switching circuits 70a and 70b receive a current control signal from the current controller 100 to switch between the values of a current to be delivered to the bias circuits 50a and 50b, respectively. The circuit configuration of the current switching circuits 70a and 70b is the same as that of the current switching circuit 70 according to the first embodiment shown in FIG. 2. The current controller 100 may send the same current control signal to all the current switching circuits 70. Alternatively, it may send different current control signals to the individual current switching circuits 70. Thus, variable control provided to the bias current to be supplied to the individual operational amplifiers 30 makes it possible to provide detailed current control.

(Third Embodiment)

Figure 6:
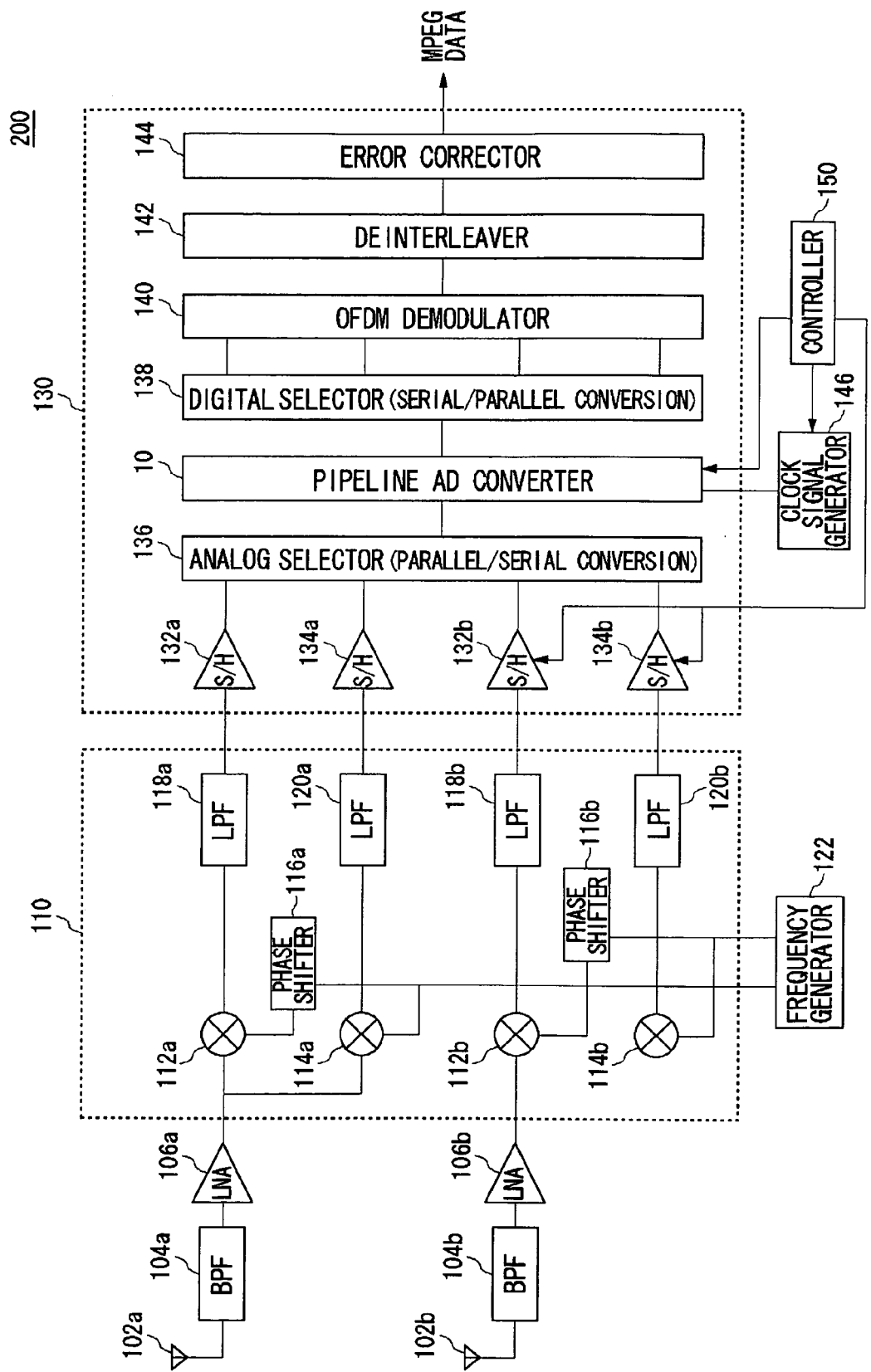
FIG. 6 is a view illustrating the whole configuration of a receiver according to a third embodiment.

FIG. 6 shows the overall configuration of a receiver 200 according to the third embodiment of the present invention. The receiver 200 is a portable type television. The receiver 200 decodes a MPEG stream in a received broadcast wave and reproduces it. The receiver 200 comprises an antenna 102a and an antenna 102b, and it is capable of diversity reception. By receiving broadcast waves by the diversity reception, even when signal received by the antenna 102a is disturbed by multipath interference caused by reflection wave and so forth, the MPEG stream can be adequately reproduced by utilizing signals received by the other antenna 102b.

The broadcast signals received by antenna 102a are band-limited by a BPF (Band Pass Filter) 104a. Thereafter, the broadcast signals are amplified by a LNA (Low Noise Amplifier) 106a and inputted to a frequency converting IC 110. In the frequency converting IC 110, the broadcast signal is multiplied by an orthogonal oscillation signal by a mixing unit 112a and a mixing unit 114a, the orthogonal oscillation signal being generated by a frequency generating circuit 122 and a phase shifter 116a. Then, by a direct conversion format, the broadcast signals are converted to I-baseband signals and Q-baseband signals which are orthogonal to each other. The high frequency components of the I-baseband signals and Q-baseband signals are respectively reduced by a low band pass filter 118a and a low band pass filter 120a. The I-baseband signals and Q-baseband signals are respectively inputted to a sample hold circuit 132a and a sample hold circuit 132b in an OFDM (Orthogonal Frequency Division Multiplexing) demodulation LSI 130.

The broadcast signals received by the antenna 102b are similarly band-limited by a BPF 104b. Thereafter, the broadcast signals are amplified by a LNA 106b and inputted to a frequency converting IC 110. In the frequency converting IC 110, the broadcast signal is multiplied by an orthogonal oscillation signal by a mixing unit 112b and a mixing unit 114b, the orthogonal oscillation signal being generated by a frequency generating circuit 122 and a phase shifter 116b. Then, by a direct conversion format, the broadcast signals are converted to I-baseband signals and Q-baseband signals which are orthogonal to each other. The high frequency components of the I-baseband signals and Q-baseband signals are respectively reduced by a low band pass filter 118b and a low band pass filter 120b. The I-baseband signals and Q-baseband signals are respectively inputted to a sample hold circuit 132a and a sample hold circuit 132b in an OFDM (Orthogonal Frequency Division Multiplexing) demodulation LSI 130.

In the OFDM demodulation LSI 130, the signals of the four series (i.e. the I-baseband signals and Q-baseband signals generated from the broadcast signals received by the antenna 102a and the I-baseband signals and Q-baseband signals generated from the broadcast signals received by the antenna 102b) are converted into digital signals by a pipelined AD converter 10 and are demodulated by an OFDM demodulator 140. Subcarriers sorted in a direction of frequency or time are deinterleaved by an deinterleaver 142 and correction processing is performed thereon by a error corrector 144. Then the MPEG data are outputted.

Here, in this embodiment, the AD conversion of the signals of the four series is carried out not by providing four AD converters but by utilizing the pipelined AD converter 10 according to the first or second embodiment in a time division manner. Therefore, analog signals held in the four sample hold circuits 132a, 134a, 132b and 134b are selected one by one by an analog selector (parallel-serial conversion) 136 and inputted into the pipelined AD converter 10. Digital signals outputted from the pipelined AD converter 10 in the time division manner are subdivided into the original four series of signals by a digital selector (serial-parallel conversion) 138. Each signal acquired by subdividing the digital signals is inputted into the OFDM demodulator 140. By implementing this configuration, circuits can be downsized. Accordingly smaller and lighter apparatus can be realized with low cost.

By the diversity reception, while high quality signal transmission can be realized, size and power consumption of circuits generally become large since a plurality of signal processing systems are required therein as have described above. In this embodiment, power consumption can be kept small by realizing a configuration in which it is possible to select a mode between two modes. The two modes are a normal mode where broadcast waves are received by solely the antenna 102a and a diversity reception mode where broadcast waves are received by both the antenna 102a and antenna 102b.

In the diversity reception mode, it is necessary to perform AD conversion on signals of the four series during same time where AD conversion is performed on signals of two series in the normal mode. Therefore, in the diversity reception mode, the pipelined AD converter 10 is operated at as twice frequency as that of the normal mode. In the diversity reception mode, for example, a clock signals of 8 MHz are provided to the pipelined AD converter 10 from a clock signal generator 146, while a clock signals of 4 MHz are provided to the pipelined AD converter 10 from the clock signal generator 146 while in the normal mode. Accordingly, it can be said in both case that each signal is AD converted at a frequency of 2 MHz.

A controller 150 controls the shift of the reception modes between the normal mode and the diversity reception mode. The controller 150, in the diversity reception mode, turns the sample hold circuits 132b and 134b ON and instructs the clock signal generator 146 to generate the clock signals of, for example, 8 MHz. On the other hand, in the normal mode, the controller 150 turns the sample hold circuits 132b and 134b OFF and instructs the clock signal generator 146 to generate the clock signals of, for example, 4 MHz. That is, the controller 150 functions as a frequency control means.

The current controller 100 in the pipelined AD converter 10 receives an instruction of operational frequency required for the pipelined AD converter 10 from the controller 150 and transmits a current control signal to the current switching circuit 70. More specifically, if the pipelined AD converter 10 is operated at high frequency such as 8 MHz in the diversity reception mode, an instruction is given from the controller 150 to provide the operational amplifier 30 with bias current sufficient for the operation. If the pipelined AD converter 10 is operated at low frequency such as 4 MHz in the normal mode, an instruction is given from the controller 150 to provide the operation amplifier 30 with bias current smaller that in the diversity reception mode. Accordingly, the power consumption can be reduced.

As above, the present invention has been described in accordance with the embodiments. These embodiments are only illustrative of the invention. Accordingly, it should be understood by those skilled in the art that various modifications can be made to the combinations of each component or each process of the embodiments without departing from the scope of the present invention. Some of those modified examples are shown below.

In the aforementioned embodiments, the descriptions were made to the pipelined AD converter as an example of a semiconductor circuit having amplifiers. However, the technique according to the present invention is also applicable to any semiconductor circuit with amplifiers such as a front-end circuit for storage use. For example, with the front-end circuit for storage use, it is possible to reduce power consumption by controlling the amount of current supplied to the operational amplifiers in accordance with the read or write rate.

In the embodiments, the pipelined AD converter having a plurality of amplifiers has been described as an example. However, the technique according to the present invention is also applicable to a semiconductor circuit having one amplifier. Furthermore, in the embodiments, an operational amplifier has been described as an example. However, the technique according to the present invention is also applicable to any amplifier such as an RF amplifier.

What is claimed is:

1. A current control method comprising:
varying a value of a current required for an amplifier to operate, in response to an operational frequency of said amplifier when said current is supplied to said amplifier, such that the higher the operational frequency of said amplifier is, the greater the current supplied to said amplifier becomes.

2. A current supply circuit for supplying a current required for an amplifier to operate, comprising:
a current switcher which receives a current control signal delivered responsive of switching between operational frequencies of said amplifier to switch between currents to be supplied to said amplifier, such that the higher the operational frequency of said amplifier is, the greater the current supplied to said amplifier becomes.

3. A semiconductor circuit comprising:
a plurality of amplifiers; and
a current switcher which receives a current control signal delivered responsive of switching between operational frequencies of said amplifier to switch between currents to be supplied to said plurality of amplifiers, such that the higher the operational frequency of said amplifier is, the greater the current supplied to said amplifier becomes.

4. The semiconductor circuit according to claim 3, further comprising:
a bias circuit which is connected to each of said plurality of amplifiers to supply a bias current to said amplifier, wherein
said current switcher switches between currents to be delivered to said bias circuit to thereby switch between currents to be supplied to said plurality of amplifiers.

5. The semiconductor circuit according to claim 3, wherein
said current switcher collectively switches between currents to be supplied to said plurality of amplifiers.

6. The semiconductor circuit according to claim 4, wherein
said current switcher collectively switches between currents to be supplied to said plurality of amplifiers.

7. The semiconductor circuit according to claim 3, wherein
said current switcher is provided corresponding to each of said plurality of amplifiers to switch between currents to be supplied to an amplifier connected to itself.

8. The semiconductor circuit according to claim 4, wherein
said current switcher is provided corresponding to each of said plurality of amplifiers to switch between currents to be supplied to an amplifier connected to itself.

9. The semiconductor circuit according to claim 5, wherein
said current switcher is provided corresponding to each of said plurality of amplifiers to switch between currents to be supplied to an amplifier connected to itself.

10. The semiconductor circuit according to claim 6, wherein
said current switcher is provided corresponding to each of said plurality of amplifiers to switch between currents to be supplied to an amplifier connected to itself.

11. An electronic device comprising:
a plurality of amplifiers;
current controller which controls a current to be supplied to said amplifier responsive of switching between operational frequencies of said amplifier, and
a current switcher which receives a current control signal delivered by said current controller to switch between currents to be supplied to said plurality of amplifiers, such that the higher the operational frequency of said amplifier is, the greater the current supplied to said amplifier becomes.

12. A current control method comprising:
varying a value of a current required for an amplifier to operate within a range in which said amplifier maintains its ideal characteristics, in response to an operational frequency of said amplifier when said current is supplied to said amplifier, such that the higher the operational frequency of said amplifier is the greater the current supplied to said amplifier becomes.

13. A current control method comprising:
varying a value of a current required for an amplifier to operate, in response to an operational clock frequency of a circuit system including said amplifier when said current is supplied to said amplifier, such that the higher the operational frequency of said amplifier is, the greater the current supplied to said amplifier becomes.

* * * * *